(12) United States Patent
Kingscott

(10) Patent No.: US 10,104,487 B2
(45) Date of Patent: Oct. 16, 2018

(54) PRODUCTION LINE PCB SERIAL PROGRAMMING AND TESTING METHOD AND SYSTEM

(71) Applicant: BRAGI GmbH, München (DE)

(72) Inventor: Lisa Kingscott, München (DE)

(73) Assignee: BRAGI GmbH, München (DE)

( * ) Notice: Subject to any disclaimer, the term of this patent is extended or adjusted under 35 U.S.C. 154(b) by 0 days.

(21) Appl. No.: 15/843,140

(22) Filed: Dec. 15, 2017

(65) Prior Publication Data

US 2018/0109891 A1 Apr. 19, 2018

Related U.S. Application Data

(62) Division of application No. 15/244,834, filed on Aug. 23, 2016, now Pat. No. 98,543,728.

(60) Provisional application No. 62/211,724, filed on Aug. 29, 2015.

(51) Int. Cl.
  *H04R 29/00* (2006.01)
  *G01R 31/28* (2006.01)
  *G01R 31/36* (2006.01)
  *H04R 1/10* (2006.01)

(52) U.S. Cl.
  CPC ....... *H04R 29/001* (2013.01); *G01R 31/2822* (2013.01); *G01R 31/2825* (2013.01); *G01R 31/3641* (2013.01); *H04R 1/10* (2013.01); *H04R 29/00* (2013.01); *H05K 999/00* (2013.01)

(58) Field of Classification Search
  CPC ........ H04R 29/001; H04R 29/00; H04R 1/10; G01R 31/2822; G01R 31/3641; G01R 31/2825
  See application file for complete search history.

(56) References Cited

U.S. PATENT DOCUMENTS

| | | | |
|---|---|---|---|
| 2,325,590 A | 8/1943 | Carlisle et al. | |
| 2,430,229 A | 11/1947 | Kelsey | |
| 3,047,089 A | 7/1962 | Zwislocki | |
| D208,784 S | 10/1967 | Sanzone | |
| 3,586,794 A | 6/1971 | Michaelis | |
| 3,934,100 A | 1/1976 | Harada | |
| 3,983,336 A | 9/1976 | Malek et al. | |

(Continued)

FOREIGN PATENT DOCUMENTS

| CN | 204244472 U | 4/2015 |
|---|---|---|
| CN | 104683519 A | 6/2015 |

(Continued)

OTHER PUBLICATIONS

Akkermans, "Acoustic Ear Recognition for Person Identification", Automatic Identification Advanced Technologies, 2005 pp. 219-223.

(Continued)

*Primary Examiner* — Brenda C Bernardi
(74) *Attorney, Agent, or Firm* — Goodhue, Coleman & Owens, P.C.

(57) ABSTRACT

A system and method for testing a wireless earpiece which provides improved efficiencies in manufacturing. Automated testing of one or more printed circuit boards of the wireless earpiece is initiated. The semi-assembled wireless earpiece is tested. End-of-line functional testing is performed. Final acoustic testing of the wireless earpiece is performed.

20 Claims, 5 Drawing Sheets

(56) References Cited

U.S. PATENT DOCUMENTS

| | | | |
|---|---|---|---|
| 4,069,400 A | 1/1978 | Johanson et al. |
| 4,150,262 A | 4/1979 | Ono |
| 4,334,315 A | 6/1982 | Ono et al. |
| D266,271 S | 9/1982 | Johanson et al. |
| 4,375,016 A | 2/1983 | Harada |
| 4,588,867 A | 5/1986 | Konomi |
| 4,617,429 A | 10/1986 | Bellafiore |
| 4,654,883 A | 3/1987 | Iwata |
| 4,682,180 A | 7/1987 | Gans |
| 4,791,673 A | 12/1988 | Schreiber |
| 4,852,177 A | 7/1989 | Ambrose |
| 4,865,044 A | 9/1989 | Wallace et al. |
| 4,984,277 A | 1/1991 | Bisgaard et al. |
| 5,008,943 A | 4/1991 | Arndt et al. |
| 5,036,479 A * | 7/1991 | Prednis ............... G01D 18/00 |
| | | | 324/754.31 |
| 5,123,016 A * | 6/1992 | Muller ............... G11C 29/44 |
| | | | 365/200 |
| 5,185,802 A | 2/1993 | Stanton |
| 5,191,602 A | 3/1993 | Regen et al. |
| 5,201,007 A | 4/1993 | Ward et al. |
| 5,201,008 A | 4/1993 | Arndt et al. |
| D340,286 S | 10/1993 | Seo |
| 5,280,524 A | 1/1994 | Norris |
| 5,295,193 A | 3/1994 | Ono |
| 5,298,692 A | 3/1994 | Ikeda et al. |
| 5,343,532 A | 8/1994 | Shugart |
| 5,347,584 A | 9/1994 | Narisawa |
| 5,363,444 A | 11/1994 | Norris |
| D367,113 S | 2/1996 | Weeks |
| 5,497,339 A | 3/1996 | Bernard |
| 5,513,099 A * | 4/1996 | Schein ............... G06T 7/0004 |
| | | | 382/149 |
| 5,596,587 A * | 1/1997 | Douglas ........... G01R 31/31834 |
| | | | 702/123 |
| 5,606,621 A | 2/1997 | Reiter et al. |
| 5,613,222 A | 3/1997 | Guenther |
| 5,654,530 A | 8/1997 | Sauer et al. |
| 5,692,059 A | 11/1997 | Kruger |
| 5,721,783 A | 2/1998 | Anderson |
| 5,748,743 A | 5/1998 | Weeks |
| 5,749,072 A | 5/1998 | Mazurkiewicz et al. |
| 5,771,438 A | 6/1998 | Palermo et al. |
| D397,796 S | 9/1998 | Yabe et al. |
| 5,802,167 A | 9/1998 | Hong |
| D410,008 S | 5/1999 | Almqvist |
| 5,929,774 A | 7/1999 | Charlton |
| 5,933,506 A | 8/1999 | Aoki et al. |
| 5,949,896 A | 9/1999 | Nageno et al. |
| 5,987,146 A | 11/1999 | Pluvinage et al. |
| 6,021,207 A | 2/2000 | Puthuff et al. |
| 6,054,989 A | 4/2000 | Robertson et al. |
| 6,081,724 A | 6/2000 | Wilson |
| 6,084,526 A | 7/2000 | Blotky et al. |
| 6,094,492 A | 7/2000 | Boesen |
| 6,111,569 A | 8/2000 | Brusky et al. |
| 6,112,103 A | 8/2000 | Puthuff |
| 6,157,727 A | 12/2000 | Rueda |
| 6,167,039 A | 12/2000 | Karlsson et al. |
| 6,181,801 B1 | 1/2001 | Puthuff et al. |
| 6,208,372 B1 | 3/2001 | Barraclough |
| 6,230,029 B1 | 5/2001 | Yegiazaryan et al. |
| 6,275,789 B1 | 8/2001 | Moser et al. |
| 6,339,754 B1 | 1/2002 | Flanagan et al. |
| D455,835 S | 4/2002 | Anderson et al. |
| 6,408,081 B1 | 6/2002 | Boesen |
| 6,424,820 B1 | 7/2002 | Burdick et al. |
| D464,039 S | 10/2002 | Boesen |
| 6,470,893 B1 | 10/2002 | Boesen |
| D468,299 S | 1/2003 | Boesen |
| D468,300 S | 1/2003 | Boesen |
| 6,542,721 B2 | 4/2003 | Boesen |
| 6,560,468 B1 | 5/2003 | Boesen |
| 6,563,301 B2 | 5/2003 | Gventer |
| 6,654,721 B2 | 11/2003 | Handelman |
| 6,664,713 B2 | 12/2003 | Boesen |
| 6,690,807 B1 | 2/2004 | Meyer |
| 6,694,180 B1 | 2/2004 | Boesen |
| 6,718,043 B1 | 4/2004 | Boesen |
| 6,738,485 B1 | 5/2004 | Boesen |
| 6,748,095 B1 | 6/2004 | Goss |
| 6,754,358 B1 | 6/2004 | Boesen et al. |
| 6,784,873 B1 | 8/2004 | Boesen et al. |
| 6,823,195 B1 | 11/2004 | Boesen |
| 6,852,084 B1 | 2/2005 | Boesen |
| 6,879,698 B2 | 4/2005 | Boesen |
| 6,892,082 B2 | 5/2005 | Boesen |
| 6,920,229 B2 | 7/2005 | Boesen |
| 6,943,614 B1 * | 9/2005 | Kuei ............... H01L 22/14 |
| | | | 257/48 |
| 6,952,483 B2 | 10/2005 | Boesen et al. |
| 6,987,986 B2 | 1/2006 | Boesen |
| 7,010,137 B1 | 3/2006 | Leedom et al. |
| 7,113,611 B2 | 9/2006 | Leedom et al. |
| D532,520 S | 11/2006 | Kampmeier et al. |
| 7,136,282 B1 | 11/2006 | Rebeske |
| 7,203,331 B2 | 4/2007 | Boesen |
| 7,209,569 B2 | 4/2007 | Boesen |
| 7,215,790 B2 | 5/2007 | Boesen et al. |
| D549,222 S | 8/2007 | Huang |
| 7,279,887 B1 * | 10/2007 | King ............... G01R 31/01 |
| | | | 324/756.02 |
| D554,756 S | 11/2007 | Sjursen et al. |
| 7,403,629 B1 | 7/2008 | Aceti et al. |
| D579,006 S | 10/2008 | Kim et al. |
| 7,463,902 B2 | 12/2008 | Boesen |
| 7,508,411 B2 | 3/2009 | Boesen |
| D601,134 S | 9/2009 | Elabidi et al. |
| 7,825,626 B2 | 11/2010 | Kozisek |
| 7,965,855 B1 | 6/2011 | Ham |
| 7,979,035 B2 | 7/2011 | Griffin et al. |
| 7,983,628 B2 | 7/2011 | Boesen |
| D647,491 S | 10/2011 | Chen et al. |
| 8,095,188 B2 | 1/2012 | Shi |
| 8,108,143 B1 | 1/2012 | Tester |
| 8,140,357 B1 | 3/2012 | Boesen |
| D666,581 S | 9/2012 | Perez |
| 8,300,864 B2 | 10/2012 | Müllenborn et al. |
| 8,406,448 B2 | 3/2013 | Lin |
| 8,436,780 B2 | 5/2013 | Schantz et al. |
| D687,021 S | 7/2013 | Yuen |
| 8,719,877 B2 | 5/2014 | Vondoenhoff et al. |
| 8,774,434 B2 | 7/2014 | Zhao et al. |
| 8,831,266 B1 | 9/2014 | Huang |
| 8,891,800 B1 | 11/2014 | Shaffer |
| 8,994,498 B2 | 3/2015 | Agrafioti et al. |
| D728,107 S | 4/2015 | Martin et al. |
| 9,013,145 B2 | 4/2015 | Castillo et al. |
| 9,037,125 B1 | 5/2015 | Kadous |
| D733,103 S | 6/2015 | Jeong et al. |
| 9,081,944 B2 | 7/2015 | Camacho et al. |
| 9,510,159 B1 | 11/2016 | Cuddihy et al. |
| D773,439 S | 12/2016 | Walker |
| D775,158 S | 12/2016 | Dong et al. |
| D777,710 S | 1/2017 | Palmborg et al. |
| 9,544,689 B2 | 1/2017 | Fisher et al. |
| D788,079 S | 5/2017 | Son et al. |
| 2001/0005197 A1 | 6/2001 | Mishra et al. |
| 2001/0027121 A1 | 10/2001 | Boesen |
| 2001/0043707 A1 | 11/2001 | Leedom |
| 2001/0056350 A1 | 12/2001 | Calderone et al. |
| 2002/0002413 A1 | 1/2002 | Tokue |
| 2002/0007510 A1 | 1/2002 | Mann |
| 2002/0010590 A1 | 1/2002 | Lee |
| 2002/0030637 A1 | 3/2002 | Mann |
| 2002/0046035 A1 | 4/2002 | Kitahara et al. |
| 2002/0057810 A1 | 5/2002 | Boesen |
| 2002/0076073 A1 | 6/2002 | Taenzer et al. |
| 2002/0118852 A1 | 8/2002 | Boesen |
| 2003/0002705 A1 | 1/2003 | Boesen |
| 2003/0065504 A1 | 4/2003 | Kraemer et al. |
| 2003/0079165 A1 * | 4/2003 | Ffrench ............ G01R 31/31856 |
| | | | 714/726 |
| 2003/0100331 A1 | 5/2003 | Dress et al. |

(56) References Cited

U.S. PATENT DOCUMENTS

| | | |
|---|---|---|
| 2003/0104806 A1 | 6/2003 | Ruef et al. |
| 2003/0115068 A1 | 6/2003 | Boesen |
| 2003/0125096 A1 | 7/2003 | Boesen |
| 2003/0218064 A1 | 11/2003 | Conner et al. |
| 2004/0070564 A1 | 4/2004 | Dawson et al. |
| 2004/0160511 A1 | 8/2004 | Boesen |
| 2005/0017842 A1 | 1/2005 | Dematteo |
| 2005/0043056 A1 | 2/2005 | Boesen |
| 2005/0094839 A1 | 5/2005 | Gwee |
| 2005/0125320 A1 | 6/2005 | Boesen |
| 2005/0148883 A1 | 7/2005 | Boesen |
| 2005/0165663 A1 | 7/2005 | Razumov |
| 2005/0196009 A1 | 9/2005 | Boesen |
| 2005/0251455 A1 | 11/2005 | Boesen |
| 2005/0266876 A1 | 12/2005 | Boesen |
| 2006/0029246 A1 | 2/2006 | Boesen |
| 2006/0073787 A1 | 4/2006 | Lair et al. |
| 2006/0074671 A1 | 4/2006 | Farmaner et al. |
| 2006/0074808 A1 | 4/2006 | Boesen |
| 2006/0166715 A1 | 7/2006 | Engelen et al. |
| 2006/0166716 A1 | 7/2006 | Seshadri et al. |
| 2006/0220915 A1 | 10/2006 | Bauer |
| 2006/0258412 A1 | 11/2006 | Liu |
| 2006/0276987 A1* | 12/2006 | Bolander ............ G06K 7/10059 702/106 |
| 2008/0076972 A1 | 3/2008 | Dorogusker et al. |
| 2008/0090622 A1 | 4/2008 | Kim et al. |
| 2008/0146890 A1 | 6/2008 | LeBoeuf et al. |
| 2008/0187163 A1 | 8/2008 | Goldstein et al. |
| 2008/0253583 A1 | 10/2008 | Goldstein et al. |
| 2008/0254780 A1 | 10/2008 | Kuhl et al. |
| 2008/0255430 A1 | 10/2008 | Alexandersson et al. |
| 2009/0003620 A1 | 1/2009 | McKillop et al. |
| 2009/0008275 A1 | 1/2009 | Ferrari et al. |
| 2009/0017881 A1 | 1/2009 | Madrigal |
| 2009/0073070 A1 | 3/2009 | Rofougaran |
| 2009/0097689 A1 | 4/2009 | Prest et al. |
| 2009/0105548 A1 | 4/2009 | Bart |
| 2009/0154739 A1 | 6/2009 | Zellner |
| 2009/0191920 A1 | 7/2009 | Regen et al. |
| 2009/0245559 A1 | 10/2009 | Boltyenkov et al. |
| 2009/0261114 A1 | 10/2009 | McGuire et al. |
| 2009/0296968 A1 | 12/2009 | Wu et al. |
| 2010/0033313 A1 | 2/2010 | Keady et al. |
| 2010/0203831 A1 | 8/2010 | Muth |
| 2010/0207651 A1* | 8/2010 | Suto ................... G01R 31/2818 324/757.02 |
| 2010/0210212 A1 | 8/2010 | Sato |
| 2010/0320961 A1 | 12/2010 | Castillo et al. |
| 2011/0102276 A1* | 5/2011 | Jimenez ............ G01R 29/0821 343/703 |
| 2011/0140844 A1 | 6/2011 | McGuire et al. |
| 2011/0239497 A1 | 10/2011 | McGuire et al. |
| 2011/0286615 A1 | 11/2011 | Olodort et al. |
| 2012/0057740 A1 | 3/2012 | Rosal |
| 2012/0155670 A1* | 6/2012 | Rutschman ......... H04M 1/6066 381/74 |
| 2013/0106454 A1* | 5/2013 | Liu ................... G01R 31/2808 324/750.25 |
| 2013/0316642 A1 | 11/2013 | Newham |
| 2013/0346168 A1 | 12/2013 | Zhou et al. |
| 2014/0014697 A1 | 1/2014 | Schmierer et al. |
| 2014/0079257 A1 | 3/2014 | Ruwe et al. |
| 2014/0106677 A1 | 4/2014 | Altman |
| 2014/0122116 A1 | 5/2014 | Smythe |
| 2014/0146973 A1* | 5/2014 | Liu ....................... H04R 29/00 381/58 |
| 2014/0153768 A1 | 6/2014 | Hagen et al. |
| 2014/0163771 A1 | 6/2014 | Demeniuk |
| 2014/0185828 A1 | 7/2014 | Helbling |
| 2014/0219467 A1 | 8/2014 | Kurtz |
| 2014/0222462 A1 | 8/2014 | Shakil et al. |
| 2014/0235169 A1 | 8/2014 | Parkinson et al. |
| 2014/0270227 A1 | 9/2014 | Swanson |
| 2014/0270271 A1 | 9/2014 | Dehe et al. |
| 2014/0335908 A1 | 11/2014 | Krisch et al. |
| 2014/0348367 A1 | 11/2014 | Vavrus et al. |
| 2015/0028996 A1 | 1/2015 | Agrafioti et al. |
| 2015/0035643 A1 | 2/2015 | Kursun |
| 2015/0036835 A1 | 2/2015 | Chen |
| 2015/0110587 A1 | 4/2015 | Hori |
| 2015/0148989 A1 | 5/2015 | Cooper et al. |
| 2015/0245127 A1 | 8/2015 | Shaffer |
| 2015/0264472 A1 | 9/2015 | Aase |
| 2015/0264501 A1* | 9/2015 | Hu ....................... H04R 29/001 381/58 |
| 2015/0358751 A1* | 12/2015 | Deng ................... H04R 1/1058 381/58 |
| 2015/0373467 A1 | 12/2015 | Gelter |
| 2015/0373474 A1 | 12/2015 | Kraft et al. |
| 2016/0033280 A1 | 2/2016 | Moore et al. |
| 2016/0072558 A1 | 3/2016 | Hirsch et al. |
| 2016/0073189 A1 | 3/2016 | Lindén et al. |
| 2016/0125892 A1 | 5/2016 | Bowen et al. |
| 2016/0353196 A1 | 12/2016 | Baker et al. |
| 2016/0360350 A1 | 12/2016 | Watson et al. |
| 2017/0059152 A1 | 3/2017 | Hirsch et al. |
| 2017/0060262 A1 | 3/2017 | Hviid et al. |
| 2017/0060269 A1 | 3/2017 | Förstner et al. |
| 2017/0061751 A1 | 3/2017 | Loermann et al. |
| 2017/0062913 A1 | 3/2017 | Hirsch et al. |
| 2017/0064426 A1 | 3/2017 | Hviid |
| 2017/0064428 A1 | 3/2017 | Hirsch |
| 2017/0064432 A1 | 3/2017 | Hviid et al. |
| 2017/0064437 A1 | 3/2017 | Hviid et al. |
| 2017/0078780 A1 | 3/2017 | Qian et al. |
| 2017/0078785 A1 | 3/2017 | Qian et al. |
| 2017/0108918 A1 | 4/2017 | Boesen |
| 2017/0109131 A1 | 4/2017 | Boesen |
| 2017/0110124 A1 | 4/2017 | Boesen et al. |
| 2017/0110899 A1 | 4/2017 | Boesen |
| 2017/0111723 A1 | 4/2017 | Boesen |
| 2017/0111725 A1 | 4/2017 | Boesen et al. |
| 2017/0111726 A1 | 4/2017 | Martin et al. |
| 2017/0111740 A1 | 4/2017 | Hviid et al. |
| 2017/0127168 A1 | 5/2017 | Briggs et al. |
| 2017/0142511 A1 | 5/2017 | Dennis |
| 2017/0151447 A1 | 6/2017 | Boesen |
| 2017/0151668 A1 | 6/2017 | Boesen |
| 2017/0151918 A1 | 6/2017 | Boesen |
| 2017/0151930 A1 | 6/2017 | Boesen |
| 2017/0151957 A1 | 6/2017 | Boesen |
| 2017/0151959 A1 | 6/2017 | Boesen |
| 2017/0153114 A1 | 6/2017 | Boesen |
| 2017/0153636 A1 | 6/2017 | Boesen |
| 2017/0154532 A1 | 6/2017 | Boesen |
| 2017/0155985 A1 | 6/2017 | Boesen |
| 2017/0155992 A1 | 6/2017 | Perianu et al. |
| 2017/0155993 A1 | 6/2017 | Boesen |
| 2017/0155997 A1 | 6/2017 | Boesen |
| 2017/0155998 A1 | 6/2017 | Boesen |
| 2017/0156000 A1 | 6/2017 | Boesen |
| 2017/0178631 A1 | 6/2017 | Boesen |
| 2017/0180842 A1 | 6/2017 | Boesen |
| 2017/0180843 A1 | 6/2017 | Perianu et al. |
| 2017/0180897 A1 | 6/2017 | Perianu |
| 2017/0188127 A1 | 6/2017 | Perianu et al. |
| 2017/0188132 A1 | 6/2017 | Hirsch et al. |
| 2017/0193978 A1 | 7/2017 | Goldman |
| 2017/0195829 A1 | 7/2017 | Belverato et al. |
| 2017/0208393 A1 | 7/2017 | Boesen |
| 2017/0214987 A1 | 7/2017 | Boesen |
| 2017/0215016 A1 | 7/2017 | Dohmen et al. |
| 2017/0230752 A1 | 8/2017 | Dohmen et al. |
| 2017/0251933 A1 | 9/2017 | Braun et al. |
| 2017/0257698 A1 | 9/2017 | Boesen et al. |
| 2017/0263236 A1 | 9/2017 | Boesen et al. |
| 2017/0273622 A1 | 9/2017 | Boesen |

FOREIGN PATENT DOCUMENTS

| | | |
|---|---|---|
| CN | 104837094 A | 8/2015 |
| EP | 1469659 A1 | 10/2004 |

(56) References Cited

FOREIGN PATENT DOCUMENTS

| | | | |
|---|---|---|---|
| EP | 1017252 | A3 | 5/2006 |
| EP | 2903186 | A1 | 8/2015 |
| GB | 2074817 | | 4/1981 |
| GB | 2508226 | A | 5/2014 |
| WO | 2008103925 | A1 | 8/2008 |
| WO | 2008113053 | A1 | 9/2008 |
| WO | 2007034371 | A3 | 11/2008 |
| WO | 2011001433 | A2 | 1/2011 |
| WO | 2012071127 | A1 | 5/2012 |
| WO | 2013134956 | A1 | 9/2013 |
| WO | 2014046602 | A1 | 3/2014 |
| WO | 2014043179 | A3 | 7/2014 |
| WO | 2015061633 | A2 | 4/2015 |
| WO | 2015110577 | A1 | 7/2015 |
| WO | 2015110587 | A1 | 7/2015 |
| WO | 2016032990 | A1 | 3/2016 |
| WO | 2016187869 | A1 | 12/2016 |

OTHER PUBLICATIONS

Announcing the $3,333,333 Stretch Goal (Feb. 24, 2014).
Ben Coxworth: "Graphene-based ink could enable low-cost, foldable electronics", "Journal of Physical Chemistry Letters", Northwestern University, (May 22, 2013).
Blain: "World's first graphene speaker already superior to Sennheiser MX400", htt://www.gizmag.com/graphene-speaker-beats-sennheiser-mx400/31660, (Apr. 15, 2014).
BMW, "BMW introduces BMW Connected-The personalized digital assistant", "http://bmwblog.com/2016/01/05/bmw-introduces-bmw-connected-the-personalized-digital-assistant", (Jan. 5, 2016).
BRAGI Is On Facebook (2014).
BRAGI Update—Arrival Of Prototype Chassis Parts—More People—Awesomeness (May 13, 2014).
BRAGI Update—Chinese New Year, Design Verification, Charging Case, More People, Timeline(Mar. 16, 2015).
BRAGI Update—First Sleeves From Prototype Tool—Software Development Kit (Jun. 5, 2014).
BRAGI Update—Lets Get Ready To Rumble, A Lot To Be Done Over Christmas (Dec. 22, 2014).
BRAGI Update—Memories From Apr.—Update On Progress (Sep. 16, 2014).
BRAGI Update—Memories from May—Update On Progress—Sweet (Oct. 13, 2014).
BRAGI Update—Memories From One Month Before Kickstarter—Update On Progress (Jul. 10, 2014).
BRAGI Update—Memories From The First Month of Kickstarter—Update on Progress (Aug. 11, 2014).
BRAGI Update—Memories From The Second Month of Kickstarter—Update On Progress (Aug. 22, 2014).
BRAGI Update—New People @BRAGI—Prototypes (Jun. 26, 2014).
BRAGI Update—Office Tour, Tour To China, Tour to CES (Dec. 11, 2014).
BRAGI Update—Status On Wireless, Bits and Pieces, Testing-Oh Yeah, Timeline(Apr. 24, 2015).
BRAGI Update—The App Preview, The Charger, The SDK, BRAGI Funding and Chinese New Year (Feb. 11, 2015).
BRAGI Update—What We Did Over Christmas, Las Vegas & CES (Jan. 19, 2014).
BRAGI Update—Years of Development, Moments of Utter Joy and Finishing What We Started(Jun. 5, 2015).
BRAGI Update-Alpha 5 and Back To China, Backer Day, On Track(May 16, 2015).
BRAGI Update-Beta2 Production and Factory Line(Aug. 20, 2015).
BRAGI Update-Developer Units Shipping and Status(Oct. 5, 2015).
BRAGI Update-Developer Units Started Shipping and Status (Oct. 19, 2015).
BRAGI Update-Developer Units, Investment, Story and Status(Nov. 2, 2015).
BRAGI Update-Getting Close(Aug. 6, 2015).
BRAGI Update-On Track, Design Verification, How It Works and What's Next(Jul. 15, 2015).
BRAGI Update-Status On Wireless, Supply, Timeline and Open House@BRAGI(Apr. 1, 2015).
BRAGI Update-Unpacking Video, Reviews On Audio Perform and Boy Are We Getting Close(Sep. 10, 2015).
Healthcare Risk Management Review, "Nuance updates computer-assisted physician documentation solution" (Oct. 20, 2016).
Hoffman, "How to Use Android Beam to Wirelessly Transfer Content Between Devices", (Feb. 22, 2013).
Hoyt et. al., "Lessons Learned from Implementation of Voice Recognition for Documentation in the Military Electronic Health Record System", The American Health Information Management Association (2017).
Hyundai Motor America, "Hyundai Motor Company Introduces A Health + Mobility Concept For Wellness In Mobility", Fountain Valley, Califorma (2017).
International Search Report & Written Opinion, PCT/EP2016/070247 (dated Nov. 18, 2016).
Last Push Before The Kickstarter Campaign Ends on Monday 4pm CET (Mar. 28, 2014).
Nemanja Paunovic et al, "A methodology for testing complex professional electronic systems", Serbian Journal of Electrical Engineering, vol. 9, No. 1, Feb. 1, 2012, pp. 71-80, XPO55317584, YU.
Nigel Whitfield: "Fake tape detectors, 'from the stands' footie and UGH? Internet of Things in my set-top box"; http://www.theregister.co.uk/2014/09/24/ibc_round_up_object_audio_dlna_iot/ (Sep. 24, 2014).
Nuance, "ING Netherlands Launches Voice Biometrics Payment System in the Mobile Banking App Powered by Nuance", "https://www.nuance.com/about-us/newsroom/press-releases/ing-netherlands-launches-nuance-voice-biometrics.html", 4 pages (Jul. 28, 2015).
Staab, Wayne J., et al., "A One-Size Disposable Hearing Aid is Introduced", The Hearing Journal 53(4):36-41) Apr. 2000.
Stretchgoal—It's Your Dash (Feb. 14, 2014).
Stretchgoal—The Carrying Case for The Dash (Feb. 12, 2014).
Stretchgoal—Windows Phone Support (Feb. 17, 2014).
The Dash + The Charging Case & The BRAGI News (Feb. 21, 2014).
The Dash-A Word From Our Software, Mechanical and Acoustics Team + An Update (Mar. 11, 2014).
Update From BRAGI—$3,000,000—Yipee (Mar. 22, 2014).
Wertzner et al., "Analysis of fundamental frequency, jitter, shimmer and vocal intensity in children with phonological disorders", V. 71, n.5, 582-588, Sep./Oct. 2005; Brazilian Journal of Othrhinolaryngology.
Wikipedia, "Gamebook", https://en.wikipedia.org/wiki/Gamebook, Sep. 3, 2017, 5 pages.
Wikipedia, "Kinect", "https://en.wikipedia.org/wiki/Kinect", 18 pages, (Sep. 9, 2017).
Wikipedia, "Wii Balance Board", "https://en.wikipedia.org/wiki/Wii_Balance_Board", 3 pages, (Jul. 20, 2017).

\* cited by examiner

PRODUCTION LINE PCB SERIAL PROGRAMMING AND TESTING METHOD AND SYSTEM

PRIORITY STATEMENT

This application claims priority to U.S. Provisional Patent Application No. 62/211,724, filed Aug. 29, 2015 and is a continuation application of U.S. patent application Ser. No. 15/244,834 filed on Aug. 23, 2016, both applications are hereby incorporated by reference in their entirety.

FIELD OF INVENTION

The present invention relates to wireless device manufacturing. More particularly, but not exclusively, the present invention relates to production line PCB serial programming and testing.

BACKGROUND

Usage of wireless devices has grown significantly in recent years as manufacturing processes, devices, and wireless standards have improved. As wireless devices become smaller and more portable, space limitations for components and circuitry become even more constrained. Space constraints are particularly limited for wireless earpieces. Such space constraints preclude the usage of significant number of tests points for device layouts utilizing printed circuit boards (PCBs). As a result, testing PCBs during the manufacturing process may be difficult, potentially resulting in additional time and equipment requirements, failed devices, extra troubleshooting, and additional expense.

SUMMARY

One aspect includes a system, method, and testing device including a processor and memory with instructions that are executed to test a wireless earpiece. Automated testing of one or more printed circuit boards of the wireless earpiece is initiated. The semi-assembled wireless earpiece is tested. End-of-line functional testing is performed. Final acoustic testing of the wireless earpiece is performed.

Another aspect includes a system for testing a wireless earpiece. The system may include a computing device connected to the wireless earpiece. The system may also include a reference wireless earpiece connected to the computing device. The computing device may be configured to initiate automated testing of one or more printed circuit boards (PCBs) of the wireless earpiece, test the semi-assembled wireless earpiece, perform end-of-line functional testing, and perform final acoustic testing of the wireless earpiece.

BRIEF DESCRIPTION OF THE DRAWINGS

Illustrative embodiments of the present invention are described in detail below with reference to the attached drawing figures, which are incorporated by reference herein and wherein.

DETAILED DESCRIPTION

The illustrative embodiments provide a system and method for production line PCB serial programming and testing. In one embodiment, the PCBs may be a component of a wireless earpiece, such as concha or external auditory canal device. When referencing the PCB herein, reference may be made to one or more PCBs, systems, sub-systems, components, or the entire device.

PCBs as well as the sub-systems of the wireless earpiece may be tested throughout the various phases of integration of the wireless earpiece. By utilizing the processes, steps, and methods herein described, the illustrative embodiments provide significant advantages in improving the efficiency of manufacturing production lines for one or more versions of wireless earpieces. In addition, substantial costs savings may be achieved by removing defective components before the defective components are further integrated into the wireless earpiece. As a result, defective devices may be removed more dynamically during the manufacturing process to preserve functioning parts instead of discarding entire systems or sub-systems of the wireless earpiece. In another embodiment, the wireless earpiece may represent any number of wireless devices.

During the described testing processes, the PCBs and corresponding wireless earpieces may be programmed to serially certify functionality of all component sets of the PCB and wireless earpiece. The testing may be performed by a testing system utilizing custom jigs that may be connected or otherwise interface to the PCBs and wireless earpieces. In one embodiment, the testing, certification, and other processes of the illustrative embodiments may be implemented utilizing four phases as herein described.

Figure 1:
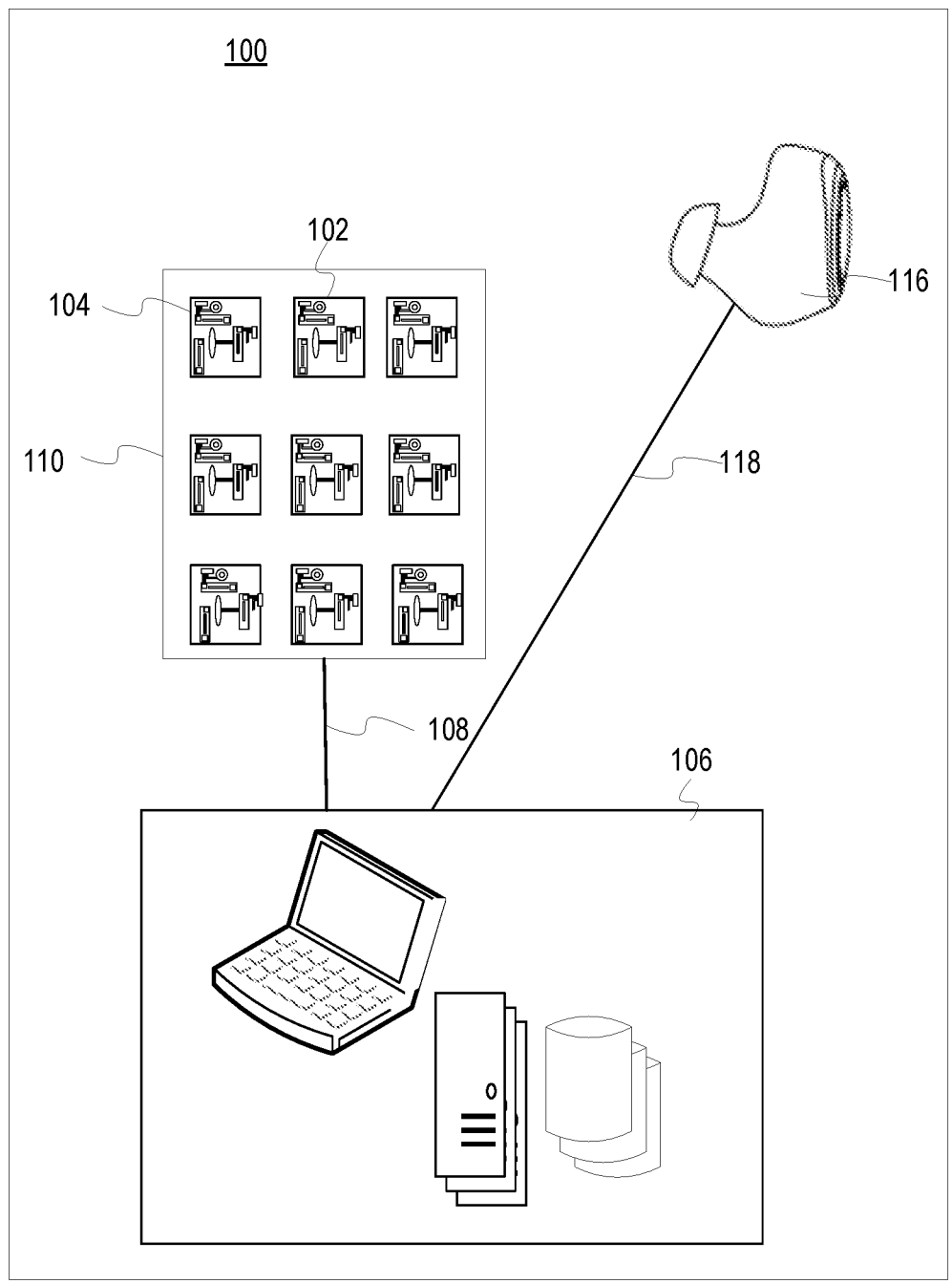
FIG. 1 is a pictorial representation of a testing system in accordance with an illustrative embodiment.

FIG. 1 is a pictorial representation of a testing system 100 in accordance with an illustrative embodiment. In one embodiment, the testing system 100 may be configured for testing an external auditory canal device, such as the wireless earpiece including the PCB 104. The testing system 100 may utilize any number of devices or components or be configured in various ways for performing the processes herein described.

In one embodiment, the testing system 100 may include a computing device 106, an interface 108, testing jigs 110, one or more devices under test (DUT) 102, a reference device 116, and an interface 118.

The computing device 106 may be a desktop computing device, specialized computing device, tablet, one or more servers, databases, or other device(s) for testing the DUT 102. The computing device 106 may represent one or more computing devices that are configured to communicate or otherwise interface with the DUT 102. In one example, the computing device 106 may represent a personal computer, server, and database for storing testing information for a number of DUTs.

The computing device 106 may have dedicated hardware and logic, such as signal generators, transceivers, signal processors, light sensors, microphones, speakers, sensors, and measuring devices that may be utilized to measure the performance, characteristics, and responses of the DUT 102. In another embodiment, the computing device 106 may include databases or instructions that are executed by a processor of the computing device to perform testing. For example, a set of instructions stored in the non-transitory memory of the computing device 106 may be executed to perform the steps herein described.

In another embodiment, all or portions of the measurement equipment may be integrated with or connected to the testing jigs 110. The computing device 106 may also be connected to one or more data or wireless networks. For example, the computing device 106 (as well as the DUT 102 may communicate with one or more wireless networks (e.g., Bluetooth, WiFi, cell, Zigbee, etc.), local area networks, or other wired networks (e.g., Ethernet, powerline, fiber optics, etc.). The networks may represent any number of public and private networks (e.g., the Internet) operated by one or more service providers. For example, testing scripts, programs, updates, or instructions may be retrieved through a number of interconnected networks including a private WiFi network, local area networks, and public or cloud networks.

The interface 108 and 118 may represent a serial connection, cable, or wire connected between the computing device 106 and the DUT 102 and the computing device 106 and the reference device 116, respectively. For example, the interfaces 108 and 118 may be USB connections from the computing device 106 to the DUT 102 and the reference device 116. The interfaces 108 and 118 may also represent wireless connections, such as Bluetooth, WiFi, near field communications, radio frequency (RF) communications, or other wireless connections that may be established utilizing transmitters, receivers, or transceivers. As a result, the functional aspects of the DUT 102 may be tested.

The testing jigs 110 physically secure the DUT 102 as well as electrically interface with the DUT 102 as a whole as well as individual components of the DUT 102 to fully test the DUT 102 and the corresponding PCBs 104. For example, the testing jigs 110 may mechanically secure the DUT 102 utilizing one or more clamps or arms. The testing jigs 110 may also include wires, micro interfaces (e.g., micro USB, etc.), BLUETOOTH or other wireless systems such as radio frequency antennas or other electrical interfaces for connecting, probing, or programming to any number of test points of the PCBs 104.

The reference device 116 may be utilized to generate reference signals for the testing and measuring the DUT 102. In addition, the reference device 116 may be utilized to communicate with the DUT 102 to perform functionality testing as is herein described. The wireless earpiece 102 may be configured for use as a pair (i.e., left ear and right ear). The reference device is used to test the magnetic induction link, to control and trace the semi-assembled DUT 102. The reference device 116 communicates via a gateway to the DUT 102. The reference device may test all major PCB component subsystems; a passing grade allows the PCB to move further down the assembly line for integration into the assembled product.

Figure 2:
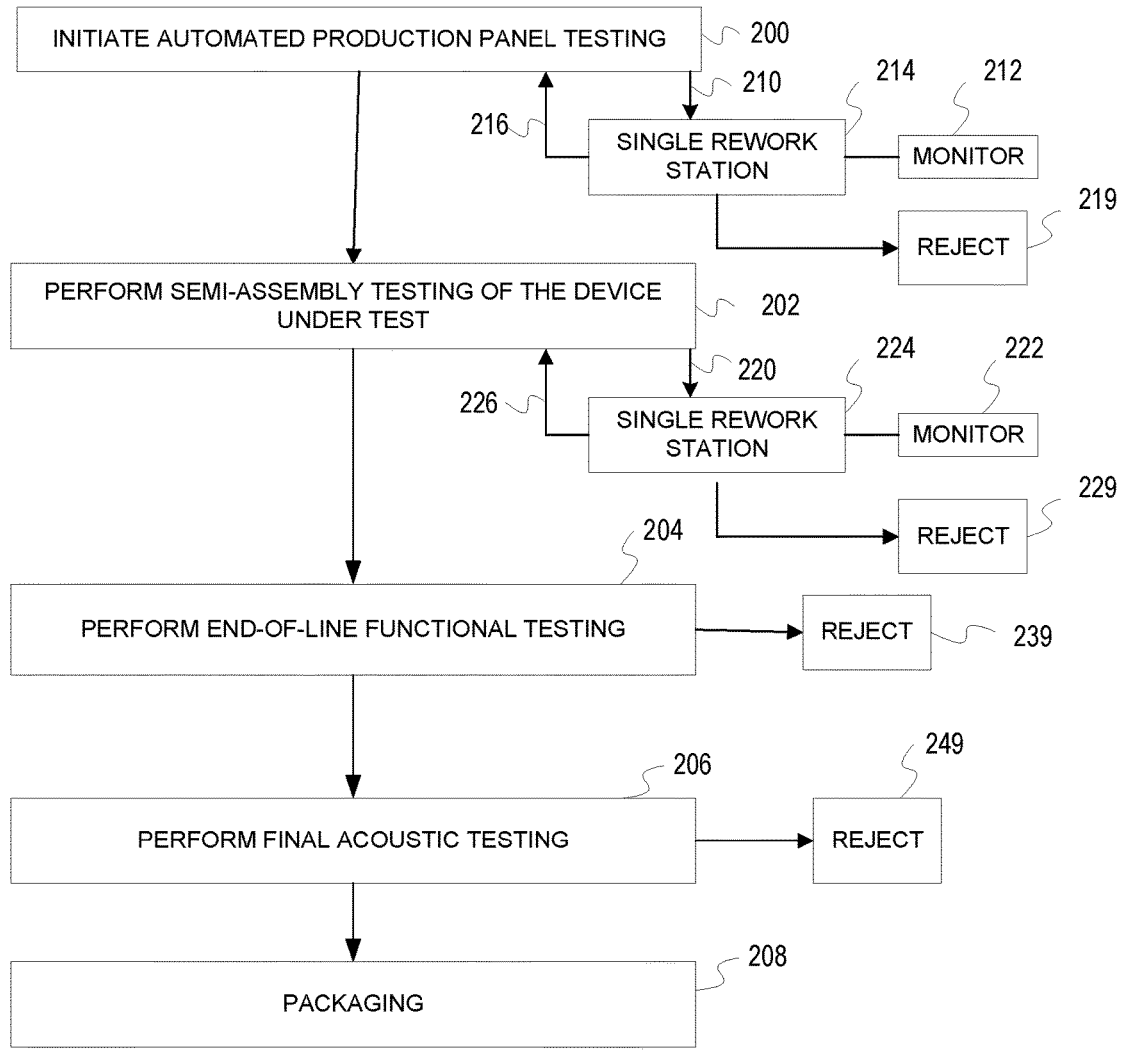
FIG. 2 is a flowchart of a process for testing a PCB of a wireless earpiece in accordance with an illustrative embodiment.

FIG. 2 is a flowchart of a process for testing a PCB of a wireless earpiece in accordance with an illustrative embodiment. The processes of FIGS. 2-4 may be implemented utilizing a testing system or device and may include multiple phases or steps as herein described. The processes may be performed on a single device at a time or for multiple devices in batches or runs of devices. In one embodiment, the PCBs of the wireless earpiece are produced on a panel that may include PCBs for a number of different devices. The test sequence may be run on each PCB associated with a device on a panel (of which each PCB may also be referred to as a device under test—DUT 102). The testing of PCBs on the panel may be performed in parallel, serially, or sequentially. Any PCBs that fail testing may be reworked (e.g., modified, refurbished, discarded, recycled, etc.). Reworking at a rework station may provide enhanced test result information for testers. After all the PCBs have been tested on the panel, the successfully evaluated devices may be removed from the panel for integration in a final product. Robotics and computerized testing logic (e.g., logic circuits, firmware, scripts, etc.) may be utilized to minimize manual user intervention in the process. For example, robotics may be used to connect the PCB/DUT to the testing jig, as well as to identify passing PCBs and select these for further assembly line integration, leaving the PCBs that do not pass on the main circuit board assembly for reworking.

The process of FIG. 2 may begin by initiating an automated production panel testing (step 200). In one embodiment, the system may include a personal computer, server, or other computing device that may be physically connected to a customized PCB. The computing device may be connected to a number of testing devices and equipment that interface with the PCB. In one embodiment, the system may utilize a unique radio frequency (RF) antenna connected to an RF test box. For example, the panel may be enclosed in a RF test box that isolates outside radio frequencies for more accurate testing. If there is a problem with the panel, the panel may be conveyed 210 to a single rework station 214 attached to a monitor 212. The single rework station 214 may provide detailed data regarding the specific reason(s) for the original test failure. At this point, either the system corrects the issue and returns 216 the DUT back for automated production panel testing 200 or else it is rejected 219.

Next, the system performs semi-assembly testing of the wireless device (step 202). During step 202, the semi-assembly of the DUT is tested utilizing a jig that connects the semi-assembled DUT to the system for automated testing. If there is a problem with the semi-assembly, the semi-assembly may be conveyed 220 to a single rework station 224 attached to a monitor 222. The single rework station 224 may provide detailed data regarding the specific reason(s) for the original test failure. At this point, either the system corrects the issue and returns 226 the semi-assembly back for automated semi-assembly testing 202 or else it is rejected 229.

Next, the system performs end-of-line functionality testing (step 204). During step 204, the wireless device may be completely formed with the battery fully enclosed inside the device. As before, custom-built jigs may be utilized for final testing of the light sensitive componentry. In one embodiment, a reference wireless earpiece may be utilized for testing the DUT. In one embodiment, the reference wireless earpiece is used to test the NFMI antenna and chip combination by communicating in such a way as to test the limits of the NFMI antenna of the DUT and replicating the most extreme conditions expected to be encountered by the DUT. The DUT is expected to communicate without errors and at the limits of the connection range. The testing jig utilized during step 204 may expose any of the potential NFMI linkage errors of the DUT. The testing jig is also utilized to test the pulse oximeter, touch sensors, and red green and blue (RGB) light emitting diodes (LEDs). In one embodiment, the jig may include a mechanical arm for engaging or activating the touch sensor(s). The testing jig may also emulate a pulse for testing the pulse oximeter. The testing jig may include light sensors or devices for detected or reflecting light generated by the LEDs. In one embodiment, the DUT may be light insulated or otherwise enclosed within a shield to ensure that ambient light does not affect the results of the testing. In another embodiment, the DUT itself is utilized to measure the LED and pulse oximetry outputs by reflecting the light emitted back onto the sensor contained within the DUT. If the DUT fails the testing, the DUT is rejected 239.

Next, the system performs final acoustic testing (step 206) with the process terminating thereafter. During the final acoustic testing of step 206, a customized testing jig is utilized to perform testing. The testing of step 206 may be performed in an acoustically isolated chamber or room for testing the external auditory canal (EAC) microphone which may be a bone microphone tuned to detect vibrations of the surrounding bony structures, EAC speaker, ambient microphone located on the superolateral segment, and audio over the NFMI linkage of the DUT.

During step 206, audio may be played into the ambient microphone of the DUT and then retransmitted by the EAC loudspeaker and recorded by the microphone placed underneath the testing jig. The recorded audio may then be analyzed against the reference signal. In one embodiment, there are four segments analyzed including: low—for example, 100+ Hz (testing of microphones and speakers for bass), mid—for example, 1000 Hz+ testing for obstruction, high—for example, 3000 Hz+ testing for reference and calibration, and white noise—looking for gaps or peaks, resonance frequencies, or blockages.

Audio may also be played into the EAC microphone and then transmitted by the NFMI to the reference wireless earpiece in the testing jig. The reference wireless earpiece may then send the audio to the computer where the signal may be analyzed against the reference signal. If it fails here, it is rejected 249. After successful performance of final acoustic testing, the successfully produced DUT is sent for packaging 208.

In one embodiment, a single customized jig may be utilized to perform testing during the different steps of FIG. 2. The illustrative embodiments provide point of production analysis and identification of component set issues. The illustrative embodiments maximize the efficiency of production, recognition failures much earlier in the production process and save money through minimizing the waste of functional component sets coupled to failed components. By finding the problems earlier in the process, components may not be irreversibly combined. In some cases, the problems may be diagnosed for preventing other devices from suffering from similar issues. Additionally, some components may be saved for reworking, reusing, or recycling where appropriate.

Figure 3:
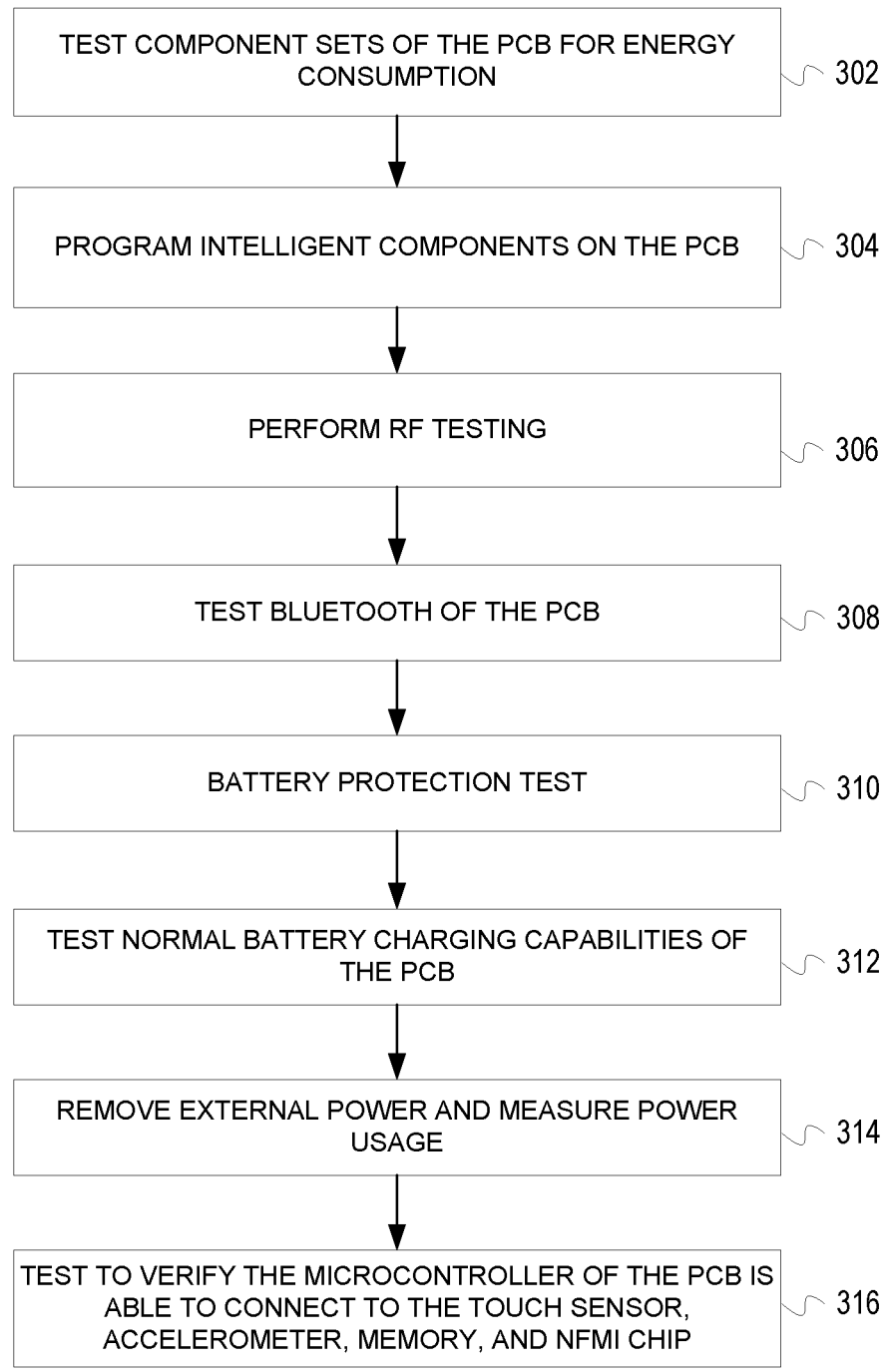
FIG. 3 is a flowchart of a process for initiating an automated production panel testing in accordance with an illustrative embodiment.

FIG. 3 is a flowchart of a process for initiating an automated production panel testing in accordance with an illustrative embodiment. In one embodiment, the process of FIG. 3 may correspond to step 200 of FIG. 2. First, the system tests component sets of the PCB for energy consumption (step 302). The system may ensure that the energy consumption (as well as the other testing measurements of the processes described herein) is within designated tolerances, thresholds, or ranges (e.g., voltage, current, power in Watts, etc.). Upper, lower, and median measurement values may be specified. Alarms may be generated or the PCB marked for reworking in response to failing any of the tests. For example, a database of the testing system may be utilized to track the test results (including failures) for subsequent analysis. A serial number, bar code, radio frequency tag, or other assigned identifier may be utilized to associate the PCB or components with the test results and measurements.

Next, the system programs intelligent components on the PCB (step 304). The PCB may include any number of intelligent or programmable components, such as Bluetooth chips, logic chips, field programmable gate arrays (FPGAs), processing chips (e.g., Kinetics ARM chip), and so forth.

Next, the system performs RF testing (step 306). In one embodiment, the Bluetooth device or RF components (e.g., Bluetooth transceiver, WiFi transceiver, etc.) may be instructed to transmit and/or receive on a planned frequency with crystal trimming being performed. Frequency adjustments may be performed to tune or tweak the frequency transmissions of the RF transceiver.

Next, the system tests Bluetooth of the PCB (step 308). In one embodiment, a number of tests may be implemented and measured according to the preset standards. In one embodiment, test data is transmitted to a receiver of the system and evaluated for errors. In addition, a noise baseline or floor may be set for the Bluetooth components of the PCB.

Next, the system performs a battery protection test of the PCB (step 310). The PCB and corresponding circuits will be checked to verify that the system is configured to utilize minimal current when battery voltage is below the manufacturer's minimum specification. Next, the system tests normal battery charging capabilities of the PCB (step 312). In one embodiment, the voltage and current utilized to charge the battery may be determined as well as the capacity of the battery when fully charged.

Next, the system removes external power and measures power usage (step 314). During step 314, the system verifies that the PCB utilizes power within a specified range when drawing power from the internal battery connection.

Next, the system tests to verify the microcontroller of the PCB is able to connect to the touch sensor, accelerometer, memory, and near-field magnetic induction (NFMI) chip (step 316). In one embodiment, test signals may be sent to each of the various sub-systems (e.g., touch sensor, accelerometer, memory, NFMI chip, radio frequency identification tag, gyroscope, etc.). Once the testing of FIG. 3 is complete, the system powers down the PCB. After a short delay the PCB is connected to a USB or other interface. The system may then determine the size of the memory available on the PCB. Configuration of the memory or uploading of default files may also be performed as needed.

Figure 4:
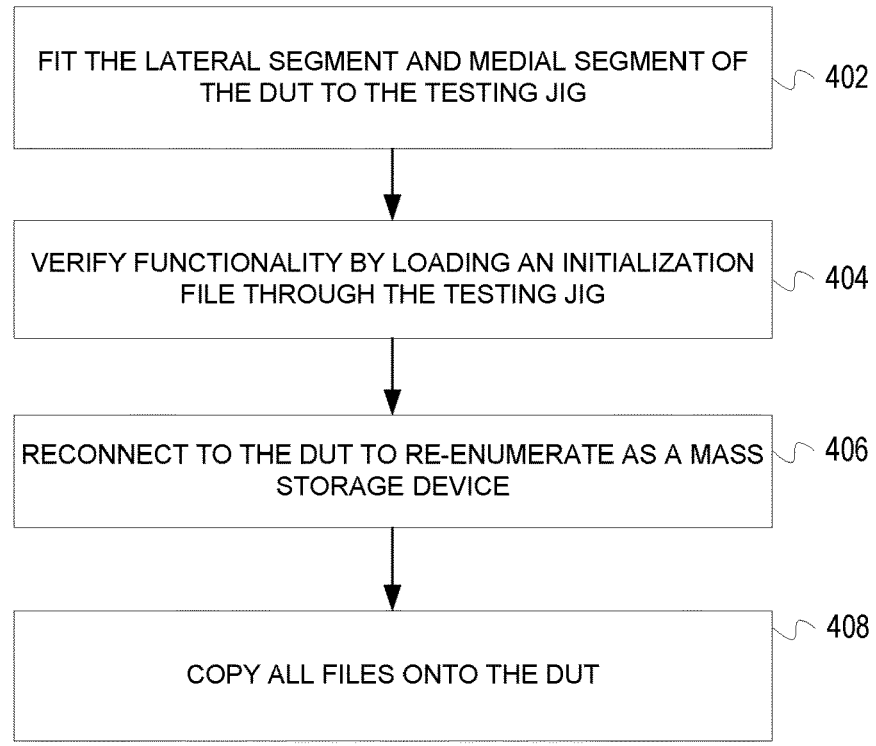
FIG. 4 is a flowchart of a process for performing semi-assembly of the wireless device in accordance with an illustrative embodiment.

FIG. 4 is a flowchart of a process for performing semi-assembly of the wireless device in accordance with an illustrative embodiment. In one embodiment, the testing of FIG. 4 may correspond to step 202 of FIG. 2. The PCB may be expensive to manufacture and as a result an electromechanical testing jig as previously described may be utilized to interface all or portions of the system (e.g., a computing device) with the PCB.

The process begins by fitting the lateral segment and the medial segment of the DUT to the jig (step 402). At this point, both the lateral and medial segments, (or sub-assemblies) are separate and have not yet been fused together allowing for changes to be made as needed before final assembly. If there is a failure of either of the lateral or medial segments, the segment may be reworked to reduced costs and minimize wastes. The medial segment is the portion of the DUT that is destined to be placed closest to the tympanic membrane.

Next, the system verifies functionality by loading an initialization file through the jig (step 404). The system loads internal software for the DUT to do testing. During step 404, the DUT is rebooted from the USB. The DUT is then ready to operate as if fully integrated. During the reboot, the DUT is expected to reboot with verification of the various internal devices including NFMI antenna (e.g., calibration), battery, pulse oximeter, amplifier, and other sub-systems and components.

Next, the system reconnects to the DUT to re-enumerate as a mass storage device (step 406). The system may be reconnected through an interface, such as a USB connection. During step 406, the initialization file previously loaded is deleted from the DUT. In addition, a trace file utilized to document functionality of the components of the DUT is copied and removed from the DUT for analysis and to determine if there are any errors.

Next, the system copies all files onto the DUT (step 408). If the DUT continues to pass each step of FIG. 4, the system copies all of the system, audio, and other files. At any time during the process of FIG. 4 if a failure occurs, the particular sub-system, such as the lateral or medial segment, is marked for reworking and further processed. After the process of FIG. 4, the sub-assemblies may be welded together.

The illustrative embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments of the inventive subject matter may take the form of a computer program product embodied in any tangible medium of expression having computer usable program code embodied in the medium. The described embodiments may be provided as a computer program product, or software, that may include a machine-readable medium having stored thereon instructions, which may be used to program a computing system (or other electronic device(s)) to perform a process according to embodiments, whether presently described or not, since every conceivable variation is not enumerated herein. A machine readable medium includes any mechanism for storing or transmitting information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read only memory (ROM); random access memory (RAM); erasable programmable memory (e.g., EPROM and EEPROM); flash memory; or other types of medium suitable for storing electronic instructions. In addition, embodiments may be embodied in an electrical, optical, acoustical or other form of propagated signal (e.g., carrier waves, infrared signals, digital signals, etc.), or wireline, wireless, or other communications medium.

Computer program code for carrying out operations of the embodiments may be written in any combination of one or more programming languages, including an object oriented programming language such as Java, Smalltalk, C++ or the like and conventional procedural programming languages, such as the "C" programming language or similar programming languages. The program code may execute entirely on a user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN), a personal area network (PAN), or a wide area network (WAN), or the connection may be made to an external computer (e.g., through the Internet using an Internet Service Provider).

Figure 5:
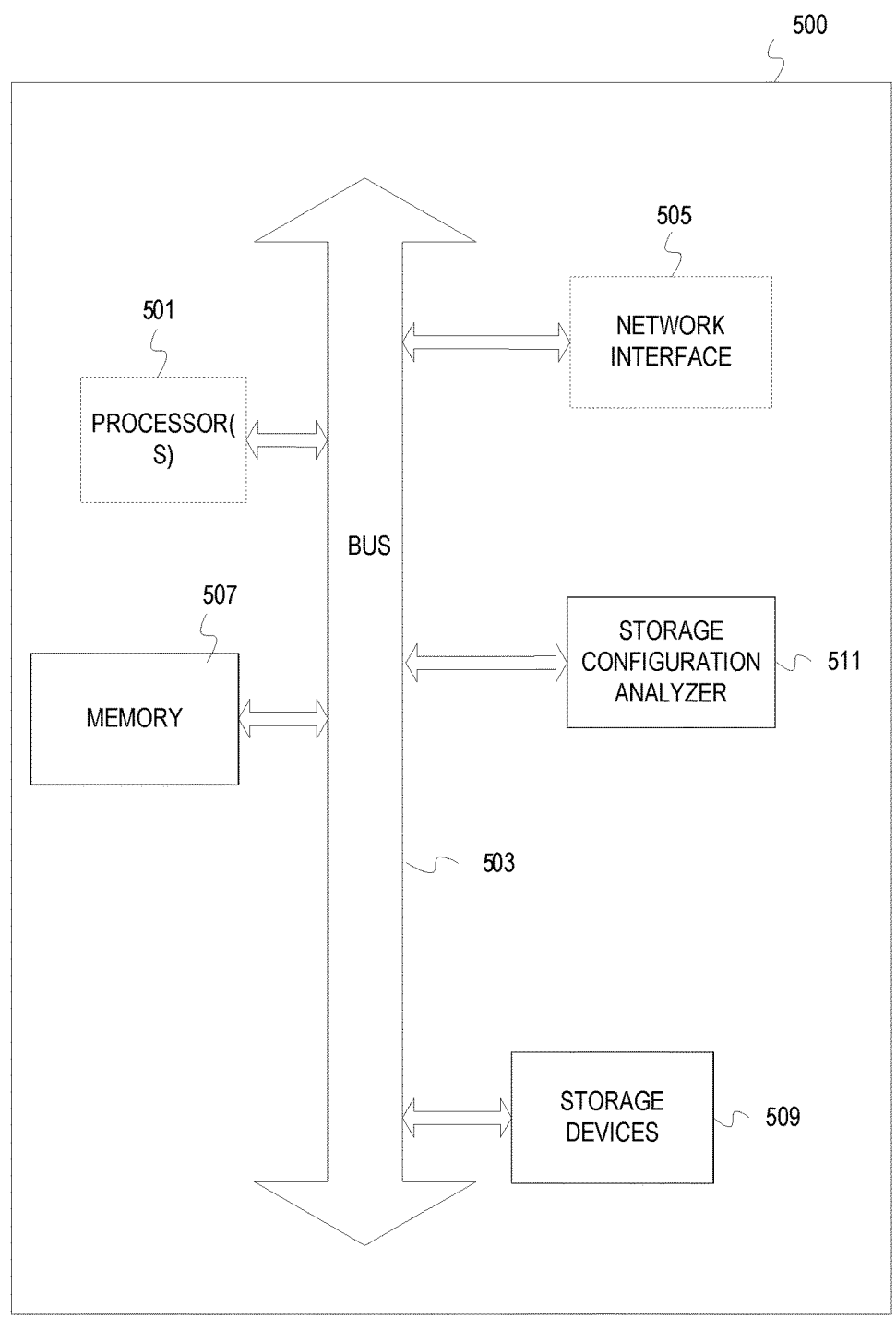
FIG. 5 depicts a computing system 500 in accordance with an illustrative embodiment.

FIG. 5 depicts a computing system 500 in accordance with an illustrative embodiment. includes a processor unit 501 (possibly including multiple processors, multiple cores, multiple nodes, and/or implementing multi-threading, etc.). The computing system includes memory 507. The memory 507 may be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable media. The computing system also includes a bus 503 (e.g., PCI, ISA, PCI-Express, Hyper-Transport®, InfiniBand®, NuBus, etc.), a network interface 505 (e.g., an ATM interface, an Ethernet interface, a Frame Relay interface, SONET interface, wireless interface, etc.), and a storage device(s) 509 (e.g., optical storage, magnetic storage, etc.). The system memory 507 embodies functionality to implement embodiments described above. The system memory 507 may include one or more functionalities that facilitate retrieval of the audio information associated with an identifier. Code may be implemented in any of the other devices of the computing system 500. Any one of these functionalities may be partially (or entirely) implemented in hardware and/or on the processing unit 501. For example, the functionality may be implemented with an application specific integrated circuit, in logic implemented in the processing unit 501, in a co-processor on a peripheral device or card, etc. Further, realizations may include fewer or additional components not illustrated in FIG. 5 (e.g., video cards, audio cards, additional network interfaces, peripheral devices, etc.). The processor unit 501, the storage device(s) 509, and the network interface 505 are coupled to the bus 503. Although illustrated as being coupled to the bus 503, the memory 507 may be coupled to the processor unit 501.

While the embodiments are described with reference to various implementations and exploitations, it will be understood that these embodiments are illustrative and that the scope of the inventive subject matter is not limited to them. In general, techniques for testing and processing wireless earpieces, PCBs, and other components as described herein may be implemented with devices, facilities, or equipment consistent with any hardware system(s). Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the inventive subject matter. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the inventive subject matter. The previous detailed description is of a small number of embodiments for implementing the invention and is not intended to be limiting in scope. The following claims set forth a number of the embodiments of the invention disclosed with greater particularity.

What is claimed:

1. A method for testing a wireless earpiece, the method comprising:
   initiating an automated production panel testing, wherein a plurality of PCB (printed circuit boards) are produced on the automated production panel;
   conveying the production panel to a first rework station if a failure occurs with the production panel during testing;
   correcting the failure and returning the production panel back for automated production panel testing; and
   rejecting the production panel if the failure cannot be corrected.

2. The method according to claim 1, further comprising the steps of:
   performing semi-assembly testing of the wireless earpiece;
   conveying the semi-assembly to a second rework station if a failure occurs with the semi-assembly during testing;
   correcting the failure and returning the semi-assembly back for semi-assembly testing; and
   rejecting the semi-assembly if the failure cannot be corrected.

3. The method according to claim 2, further comprising the step of performing end-of-line functional testing.

4. The method according to claim 3, further comprising the step of rejecting the wireless earpiece if a failure is detected during end-of-line functional testing.

5. The method according to claim 4, further comprising the step of performing final acoustic testing on the wireless earpiece.

6. The method according to claim 5, further comprising the step of rejecting the wireless earpiece if a failure is detected during final acoustic testing.

7. The method according to claim 6, further comprising the step of packaging the wireless earpiece.

8. A system for testing a wireless earpiece, the system comprising:
   a computing device operably coupled to a production panel for automated testing, wherein a plurality of PCB (printed circuit boards) are produced on the production panel, wherein the PCBs are components of the wireless earpiece;
   a first rework station for receiving a failed production panel from the computing device; and
   a first monitor operably coupled to the first rework station providing data regarding the reason for the production panel failing; wherein the failed production panel is rejected if the first rework station cannot repair the failed production panel and the failed production panel is returned to the computing device for production panel automated testing if the failed production panel can be repaired or defective components can be removed to prevent integration into a semi-assembly.

9. The system according to claim 8, further comprising a second rework station for receiving a failed semi-assembly from the computing device; and
   a second monitor operably coupled to the second rework station providing data regarding the reason for the semi-assembly failing; wherein the failed semi-assembly is rejected if the second rework station cannot repair the failed semi-assembly and the failed semi-assembly is returned to the computing device for semi-assembly testing if the failed semi-assembly can be repaired.

10. The system according to claim 9, wherein the computing device performs end-of-line functional testing.

11. The system according to claim 10, wherein the wireless earpiece is rejected if a failure is detected during end-of-line functional testing.

12. The system according to claim 11, wherein the computing device performs final acoustic testing of the wireless earpiece and rejects any failed wireless earpiece.

13. The system according to claim 11, wherein the wireless earpiece is packaged.

14. A method for testing a wireless earpiece, the method comprising:
   initiating an automated production panel testing, wherein a plurality of PCB (printed circuit boards) are produced on the automated production panel;
   conveying the production panel to a first rework station if a failure occurs with the production panel during testing;
   correcting the failure and returning the production panel back for automated production panel testing;
   rejecting the production panel if the failure cannot be corrected, wherein defective components are removed before being integrated into a semi-assembly;
   performing semi-assembly testing of the wireless earpiece;
   conveying the semi-assembly to a second rework station if a failure occurs with the semi-assembly during testing;
   correcting the failure and returning the semi-assembly back for semi-assembly testing; and
   rejecting the semi-assembly if the failure cannot be corrected.

15. The method according to claim 14, further comprising the step of performing end-of-line functional testing.

16. The method according to claim 15, further comprising the step of rejecting the wireless earpiece if a failure is detected during end-of-line functional testing.

17. The method according to claim 16, further comprising the step of performing final acoustic testing on the wireless earpiece.

18. The method according to claim 17, further comprising the step of rejecting the wireless earpiece if a failure is detected during final acoustic testing.

19. The method according to claim 18, further comprising the step of packaging the wireless earpiece.

20. The method according to claim 19, further comprising the step of testing component sets of a PCB for energy consumption.

* * * * *